United States Patent
Kurahashi

(10) Patent No.: US 7,502,537 B2
(45) Date of Patent: Mar. 10, 2009

(54) OPTICAL FIBER-BUNDLE AND FIBER-OPTIC PROCESSING EQUIPMENT USING THE SAME

(75) Inventor: Shinsuke Kurahashi, Hyogo (JP)

(73) Assignee: Panasonic Corporation, Osaka (JP)

( * ) Notice: Subject to any disclaimer, the term of this patent is extended or adjusted under 35 U.S.C. 154(b) by 141 days.

(21) Appl. No.: 11/512,597

(22) Filed: Aug. 30, 2006

(65) Prior Publication Data
US 2007/0045256 A1 Mar. 1, 2007

(30) Foreign Application Priority Data
Aug. 31, 2005 (JP) .............................. 2005-251166

(51) Int. Cl.
*G02B 6/04* (2006.01)
(52) U.S. Cl. ........................ 385/118; 385/116; 385/117; 385/115
(58) Field of Classification Search ................. 385/109, 385/110, 111, 112, 115, 116, 117, 119, 120, 385/121
See application file for complete search history.

(56) References Cited

U.S. PATENT DOCUMENTS

| | | | | |
|---|---|---|---|---|
| 4,050,819 A | * | 9/1977 | Lichtman | ..................... 356/51 |
| 5,013,151 A | * | 5/1991 | Hughes | ....................... 385/116 |
| 5,061,995 A | * | 10/1991 | Lia et al. | ..................... 385/117 |
| 5,212,756 A | * | 5/1993 | Eoll | ............................ 385/114 |
| 5,222,181 A | * | 6/1993 | Adams | ........................ 385/122 |
| 5,321,785 A | * | 6/1994 | Iida et al. | ....................... 385/85 |
| 5,852,699 A | * | 12/1998 | Lissotschenko et al. | ..... 385/115 |
| 6,112,003 A | * | 8/2000 | Bybee et al. | ................. 385/116 |
| 6,595,674 B1 | * | 7/2003 | Yoneda | ........................ 385/115 |
| 6,646,272 B2 | * | 11/2003 | Rushbrooke et al. | ........ 385/120 |
| 6,936,004 B2 | * | 8/2005 | Utsui | .......................... 385/115 |
| 2004/0033037 A1 | * | 2/2004 | Suzuki et al. | ............... 385/115 |
| 2004/0136666 A1 | * | 7/2004 | Bruun-Larsen et al. | ..... 385/115 |
| 2005/0276554 A1 | * | 12/2005 | Russert et al. | .............. 385/115 |

FOREIGN PATENT DOCUMENTS

JP 02-142695 5/1990

* cited by examiner

*Primary Examiner*—James P Hughes
(74) *Attorney, Agent, or Firm*—RatnerPrestia

(57) ABSTRACT

A fiber-bundle disclosed has: a bundle of a plurality of optical fibers each receives a light beam in one end and emits the light beam from the other end; and an adjuster to adjust positions of a plurality of optical fibers. The configuration can realize a wide variety of irradiation patterns easily and freely.

15 Claims, 10 Drawing Sheets

OPTICAL FIBER-BUNDLE AND FIBER-OPTIC PROCESSING EQUIPMENT USING THE SAME

FIELD OF THE INVENTION

The present invention relates to a fiber-bundle for use in a fiber-optic processing of soldering component parts on a printed circuit board or the like by using a light source such as for instance a semiconductor laser or the like and a fiber-optic processing equipment using the same.

BACKGROUND ART

In recent years, a fiber-optic processing has been developed by using a semiconductor laser and optical fibers to carry out works such as soldering or the like.

As the first example, a conventional fiber-optic processing equipment is disclosed that has: a laser diode element (not shown, hereafter referred to as an LD element); one optical fiber (single fiber) 113; and condenser lens 106 as shown in FIG. 6. The equipment allows a light beam emitted from the LD element to enter into optical fiber 113 to be guided to a predetermined position to carry out for instance soldering component parts on a printed circuit board by irradiating the light beam from optical fiber 113 to be focused on a soldering area by condenser lens 106.

As the second example, another conventional fiber-optic processing equipment is disclosed in Unexamined Japanese Patent Publication No. H02-142695 that has: a plurality of LD elements 105; fiber-bundle 114 including a plurality of optical fibers 123; and condenser lens 106. The equipment allows each light beam emitted from LD element to enter into optical fiber 123 to be guided to a predetermined position to carry out for instance soldering component parts on a printed circuit board by irradiating the light beam from optical fiber 123 to be focused on a soldering area by condenser lens 106.

To solder component parts on a printed circuit board, lead (conductive pin) 110 of component parts 109 is inserted into through-hole 108, and allowing them to stand for a while, soldering areas such as land 107 and lead 110 of the component parts are needed to be irradiated for preheating to improve solder wettability. In the first example of the conventional fiber-optic processing equipment, the light beam irradiation pattern on a soldering area for the preheating is formed of a shape similar to single fiber 113 or a round shape as shown in FIG. 9. Since the light beam irradiates the whole circle as shown in FIG. 6, a portion of the irradiation have reached a surface of component parts 109, or an area indicated by circle 120, via through-hole 108, causing a problem on component parts 109.

Additionally, using fiber-bundle 114 composed of a plurality of optical fibers 123 as shown in FIG. 10 will also cause the same problem, if whole cross-sectional area of fiber-bundle 114 is fully occupied by optical fibers. That is, as shown in FIG. 8, a portion of irradiation light beam will reach a surface of component parts 109 or an area indicated by circle 120 via through-hole 108, causing a problem on component parts 109.

Contrarily, in the second example of the conventional fiber-optic processing equipment, it is described that a wide variety of irradiation patterns can be selected by changing the bundle configuration of fiber-bundle 114 used for the equipment. In this way, the above problems can be solved by changing the focusing patterns of light beam for instance into annular or doughnut shaped.

In this case, however, a plurality of fiber-bundles 114 having annular irradiation area and with different irradiation diameters are needed to be prepared for replacement with respect to shapes of processing objectives, causing problems in production cost and workability. To measure the problem a configuration is proposed in which optical fibers 123 are provided in whole cross-sectional area of fiber-bundle 114 and output of each optical fiber 123 is controlled individually as shown in FIG. 10, enabling fiber-bundle 114 to have an annular irradiation pattern whose ring diameter can be variable, thereby resulting in no need of replacing fiber-bundle 114 with respect to each processing objective. The configuration, however, is not economical since fiber-bundle 114 needs a large number of optical fibers 123 extra and also needs additional structure to control output of each optical fiber 123, causing a complicated structure and an increase in production cost. Moreover, a problem in this case is that the irradiation area can be adjusted only discretely but not continuously or finely since a ring diameter of the irradiation pattern is restricted by the clearance with which optical fibers are disposed. The irradiation area should be adjusted finely in precision soldering.

SUMMARY OF THE INVENTION

The fiber-bundle disclosed in the present invention has: a plurality of optical fibers each receives light beam in one end and emits the light beam from the other end; and an adjuster to adjust positions of a plurality of the optical fibers. The configuration can realize a wide variety of irradiation patterns easily and freely.

The fiber-optic processing equipment of the present invention has: a plurality of light sources; a bundle of a plurality of optical fibers each receives light beam emitted from the light source and irradiates the light beam from the other end; a fiber-bundle having an adjuster to adjust each position of a plurality of optical fibers bundled to form a fiber-bundle; and a condenser to focus light beam emitted from the fiber-bundle. The configuration can irradiate light beam suitably with respect to processing objectives to achieve a high quality soldering.

DETAILED DESCRIPTION OF THE INVENTION

Exemplary Embodiment 1

Figure 1:
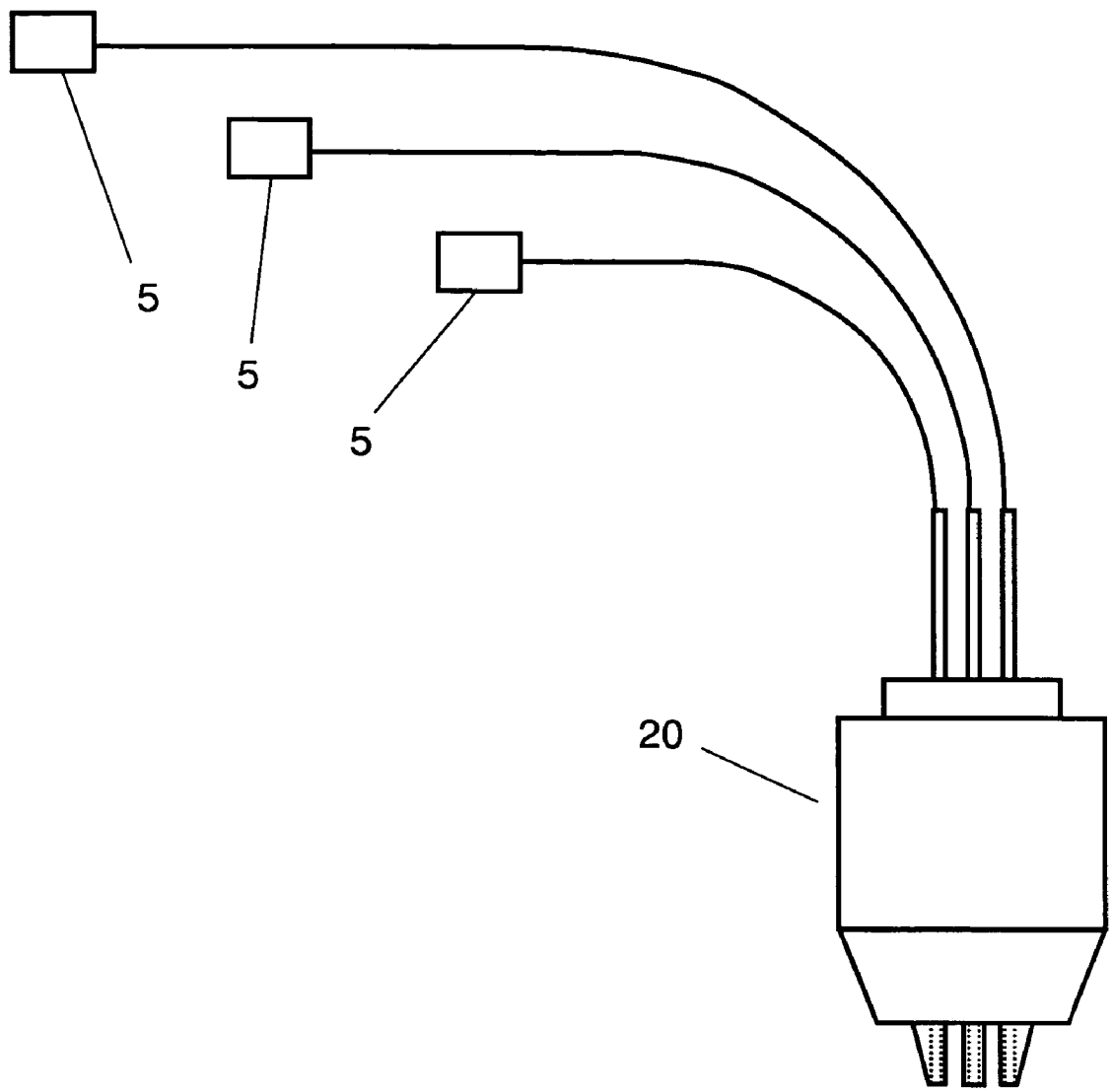
FIG. 1 shows a schematic view of an example of a fiber-bundle connected to laser diode elements in a fiber-optic processing equipment in accordance with exemplary embodiment 1.
Figure 2:
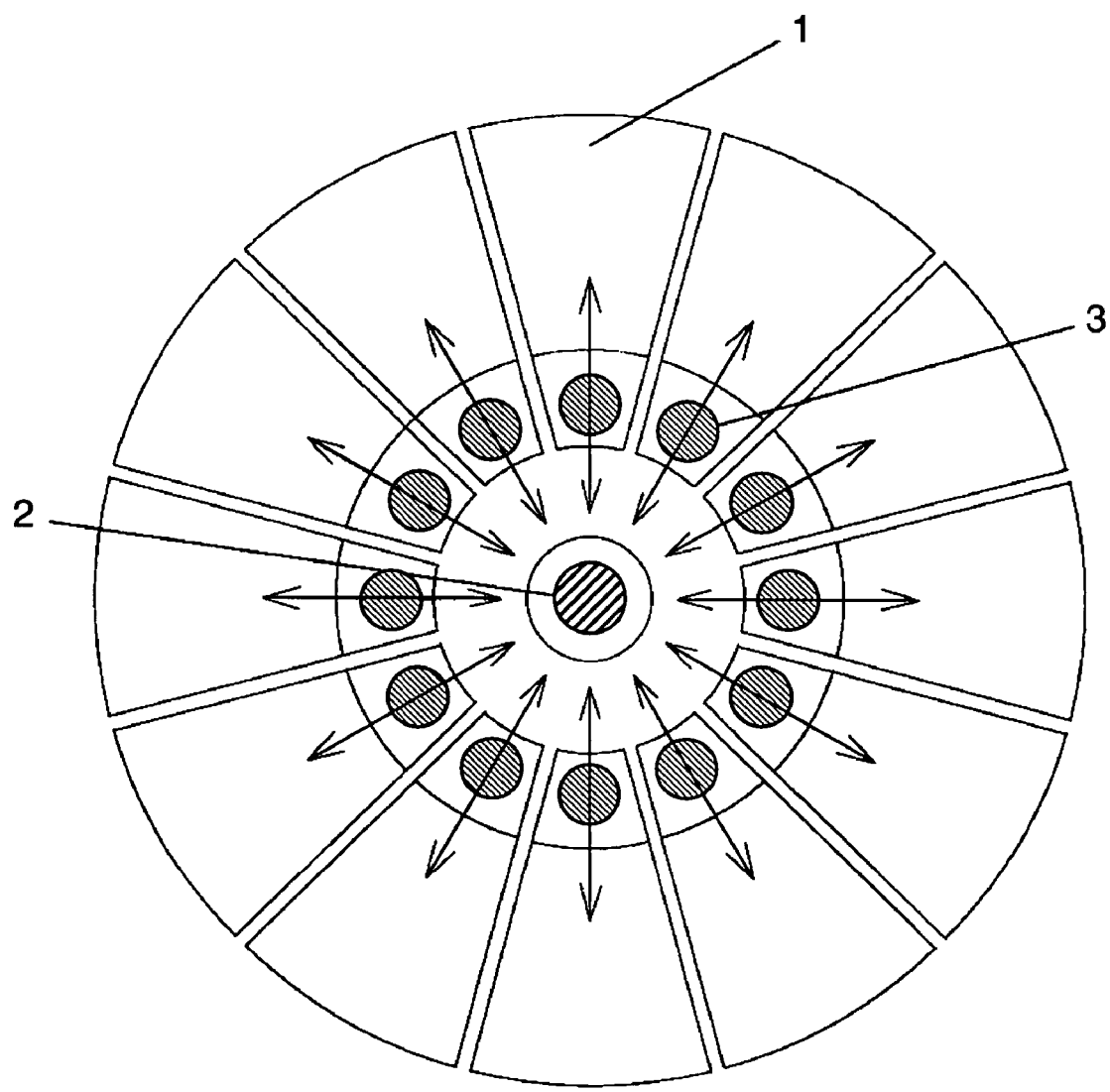
FIG. 2 shows a plan view from the light beam irradiation side of the fiber-bundle in accordance with exemplary embodiment 1.
Figure 3:
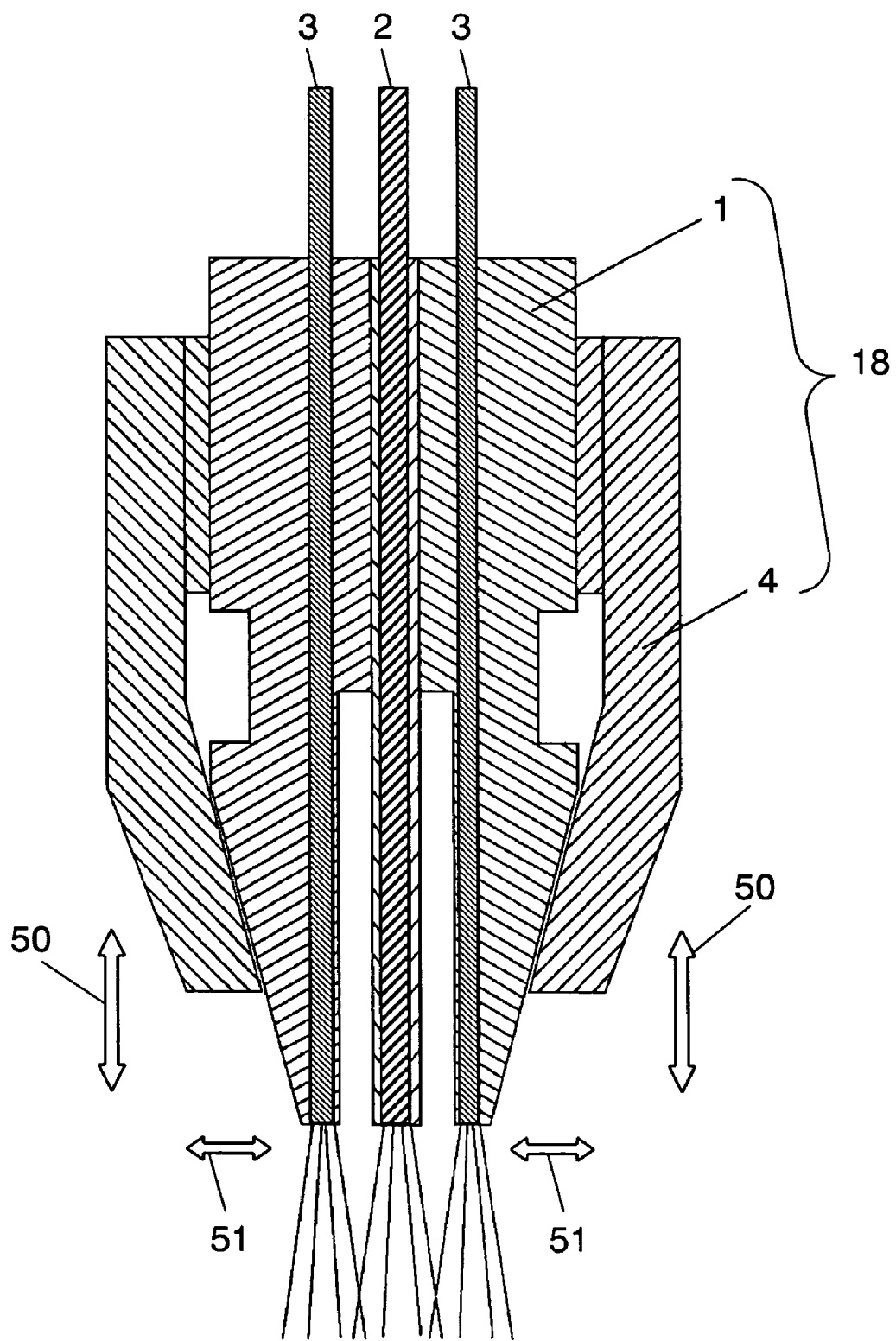
FIG. 3 shows a cross-sectional view of the fiber-bundle in accordance with exemplary embodiment 1.

FIG. 1 shows a schematic view of an example of fiber-bundle 20 connected to laser diode elements (hereafter abbreviated to LD elements) 5 in a fiber-optic processing equipment in accordance with exemplary embodiment 1 of the present invention, FIG. 2 shows a plan view from the side of light beam irradiation fiber-bundle 20, and FIG. 3 shows a cross-sectional view of fiber-bundle 20. Fiber-bundle 20, described later in detail, includes optical fiber holder 1, optical fibers 2, annularly disposed optical fiber 3 and runner 4.

Optical fiber holder 1 of fiber-bundle 20 has a tapered end separated into a plurality of tips as shown in FIGS. 2 and 3. In addition, optical fiber holder 1 is provided with a hole processed in the center to dispose optical fiber 2. Each separated tip is provided with a hole processed to dispose optical fiber 3 annularly. Optical fiber 2 and optical fibers 3 are inserted into the holes in the aforementioned optical fiber holder 1 to be held fixed there. That is, fiber-bundle 20 has further optical fiber 2 disposed in the center of a plurality of optical fibers 3 disposed annularly. These optical fiber 2 and optical fibers 3 are connected to LD elements 5 in one end to receive incoming light beam and then to emit the light beam from the other end.

Runner 4 has a tapered end and is disposed outside optical fiber holder 1 as shown in FIG. 3. Positions of optical fibers 3 disposed annularly can be varied as indicated by arrow 51 in the drawing by moving a position of runner 4 vertically as indicated by arrow 50. As described above, fiber-bundle 20 bundles a plurality of optical fibers 3 each to receive incoming light beam in one end and emit the incoming light beam from the other end and has adjuster 18 to adjust each position of a plurality of optical fibers 3. Adjuster 18 has optical fiber holder 1 to fix a plurality of optical fibers 3 as a holder part and runner 4 to move the light beam emitting portions in optical fiber holder 1 as a mechanical part.

For instance, therefore, when runner 4 is moved upward or to the side of light beam incoming to optical fibers 3, the tapered separated portions of optical fiber holder 1 will be induced to a compressed condition. This allows each separated tip of tapered end of optical fiber holder 1 to deform elastically so as to fall inward to the center, resulting in optical fiber 3 disposed on each tip of separated tapered end of optical fiber holder 1 annularly to move in the direction so as to gather in the center as indicated by the arrow in FIG. 2. Contrary, when runner 4 is moved downward or to the side of light beam emitting from optical fibers 3, optical fibers 3 will move in the direction to expand to the periphery as indicated by the arrow in FIG. 2.

As described above, runner 4 acting as a mechanical part in fiber-bundle 20 can move the light beam emitting portion of optical fiber holder 1 by varying pressures applied on optical fiber holder 1 acting as a holder part. That is, by adjusting the amount of compression pressure applied on optical fiber holder 1 by runner 4, the amount of elastic deformation for the separated tips of tapered end of optical fiber holder 1 can be adjusted. Consequently, this can adjust positions of optical fibers 3 disposed annularly freely. By adjusting the positions of optical fibers 3, the irradiation pattern formed of light beam emitted from optical fibers 3 disposed annularly can be varied.

As described in the above embodiment, fiber-bundle 20 can vary the diameter of a light ring formed of an irradiation from a plurality of optical fibers 3 by varying the ring diameter formed of optical fibers 3 disposed annularly by using adjuster 18. Since runner 4 can move continuously, the ring diameter formed of optical fibers 3 disposed annularly can be varied steplessly as shown in FIG. 3.

As described above, a plurality of fiber-bundles with different specifications are not necessary to prepare for replacement with respect to irradiation patterns since fiber-bundle 20 can realize a wide variety of irradiation patterns by itself easily and freely.

Additionally, fiber-bundle 20 does not need to include many optical fibers to have a wide variety of irradiation patterns only by controlling output from LD element into each of the optical fiber. That is, the configuration can realize a wide variety of irradiation patterns easily and freely instead of changing the quantity of fiber-bundle or LD element to use.

Additionally, fiber-bundle 20 has a irradiation pattern that does not vary discretely or discontinuously, but can vary continuously since the diameter of a light ring formed of an irradiation from a plurality of optical fibers 3 can be adjusted steplessly.

Exemplary Embodiment 2

In this embodiment 2, elements similar to those of embodiment 1 have the same reference marks and the detailed descriptions are omitted.

Figure 4:
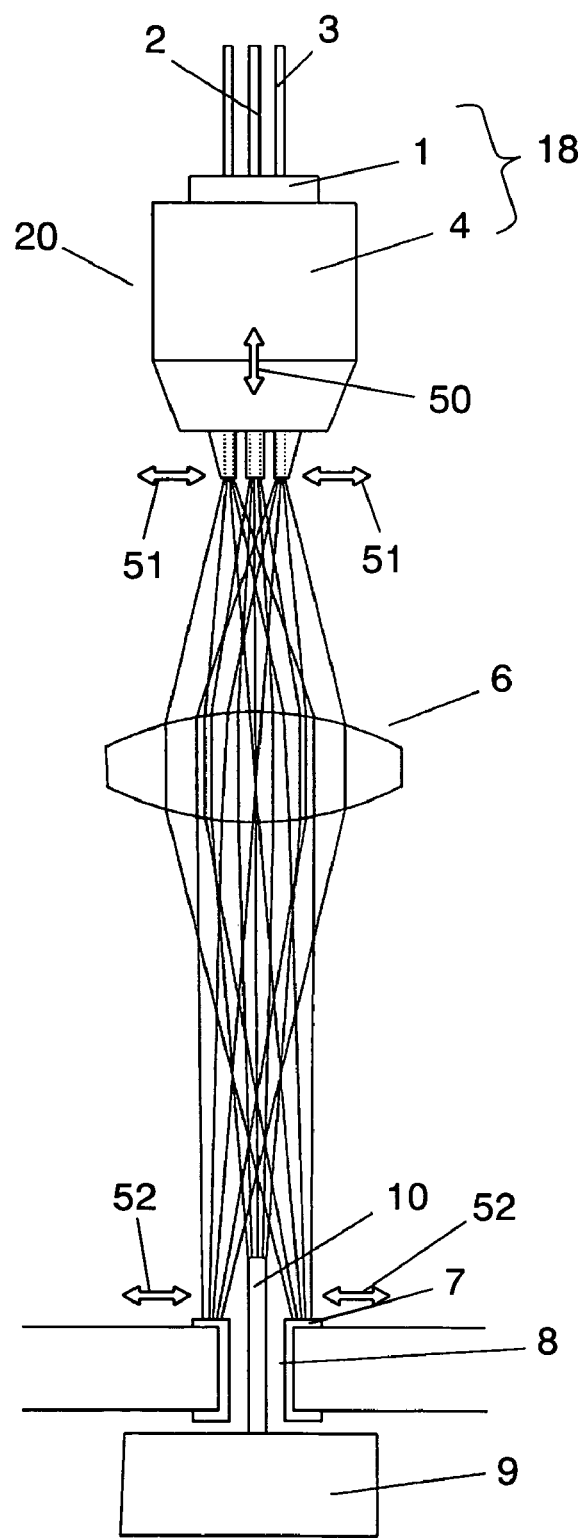
FIG. 4 shows a schematic view of an essential part for fiber-optic processing of the fiber-optic processing equipment in accordance with exemplary embodiment 2.

An example of fiber-bundle 20 described in embodiment 1 used for a fiber-optic processing equipment is described in this embodiment 2 with reference to FIG. 4. FIG. 4 shows only an essential part for fiber-optic processing in the fiber-optic processing equipment.

FIG. 4 shows a schematic view of an essential part for fiber-optic processing in the fiber-optic processing equipment in accordance with exemplary embodiment 2 of the present invention. As shown in FIG. 4, the fiber-optic processing equipment in this embodiment 2 includes: fiber-bundle 20 described in embodiment 1; and condenser lens 6 to focus the light beam emitted from fiber-bundle 20, wherein fiber-bundle 20 includes, a plurality of LD elements not shown in the drawing, optical fiber 2 and optical fibers 3 each connected to LD element, optical fiber holder 1 to fix optical fiber 2 and optical fibers 3, and runner 4 disposed outside optical fiber holder 1, Namely, the fiber-optic processing equipment includes: the light source that includes a plurality of LD elements; optical fibers 3 that receive light beam emitted from a plurality of LD elements and emit the light beam from the other end; fiber-bundle 20 that includes optical fiber holder 1 and runner 4 to adjust each position of a plurality of optical fibers 3 to act as adjuster 18; and condenser lens 6 that focuses the light beam emitted from fiber-bundle 20 to act as a focusing section.

The printed circuit board is provided with land 7 and through-hole 8 into which lead (conductive pin) 10 of component parts 9 is inserted to be soldered on the printed circuit board.

An example of procedures to solder component parts 9 on the printed circuit board is described with reference to FIG. 4.

First, lead 10 of component parts 9 is inserted into through-hole 8 of the printed circuit board as shown in FIG. 4.

Next, the ring diameter formed of optical fibers 3 disposed annularly is adjusted by moving the position of runner 4 vertically as indicated by arrow 50 in the drawing so as to obtain a suitable irradiation pattern for processing objectives with respect to shapes and dimensions or the like of land 7 and through-hole 8. The adjustment varies the position of optical fibers 3 disposed annularly as indicated by arrow 51 in the drawing. The light beam emitted from optical fibers 3 moves in the direction indicated by arrow 52 in the drawing consequently.

As described above on the fiber-optic processing equipment of this embodiment 2, adjuster 18 included in fiber-bundle 20 is provided with: optical fiber holder 1, acting as a holder part, to fix a plurality of optical fibers 3; and runner 4, acting as a mechanical part, to move light beam emitting portions of optical fiber holder 1. Runner 4 can move the light beam emitting portion of optical fiber holder 1 by varying the pressure applied on optical fiber holder 1.

The light beam should be adjusted so as not to reach component parts 9 via through-hole 8 but to focus only on the surface of land 7. The adjustment should preferably be carried out before irradiating the light beam on processing objectives. The ring diameter formed of disposed optical fibers 3 may be adjusted according to the relation between the ring diameter formed of disposed optical fibers 3 and each processing objectives stored beforehand in a database.

As described in the above embodiment 2, fiber-bundle 20 included in the fiber-optic processing equipment can vary the diameter of a light ring formed of the irradiation from a plurality of optical fibers 3 by varying the ring diameter formed of optical fibers 3 disposed annularly by using adjuster 18.

LD elements allow to irradiate a predetermined amount of light beam for preheating lead 10 of component parts 9 and land 7 of printed circuit board to improve the solder wettability. At this time as mentioned above, positions of optical fibers 3 have been adjusted such that the light beam emitted from optical fibers 3 will not reach component parts 9, causing no trouble such as burns in a root of lead 10 of component parts 9 or the like.

Fiber-bundle 20 has further optical fiber 2 disposed in the center of optical fibers 3 disposed annularly and the light beam emitted from optical fiber 2 focuses only on lead 10 of component parts 9. Therefore, no light beam travels via through-hole 8, resulting in no burning in the root of lead 10 of component parts 9. Subsequently, in a preheated state a solder is supplied to the area to carry out soldering.

As described above in this embodiment 2, since the light beam emitted from a plurality of optical fibers 3 disposed annularly can be adjusted individually to focus only on the surface of land 7, avoiding through-hole 8, by adjusting the diameter of the ring formed of optical fibers 3 disposed annularly, the fiber-optic processing equipment can irradiate light beam suitably with respect to processing objectives to achieve a high quality soldering, causing no problems on component parts 9 due to the irradiated light beam, even if for instance ratios of the diameter of lead 10 of component parts 9 or through-hole 8 to the diameter of land 7 differ respectively.

Moreover, combining with condenser lenses 6 having different focal lengths, the fiber-bundle can not only change the ring shape but can also expand or contract images of the ring shape, enabling the fiber-bundle to have a wider applicability of objectives for heating.

Although in the example described in embodiment 1 and 2, optical fiber holder 1 has the tapered end with a plurality of separated tips but the present invention is not limited to the example. Another example of optical fiber holder 1 is described with reference to FIG. 5.

Figure 5:
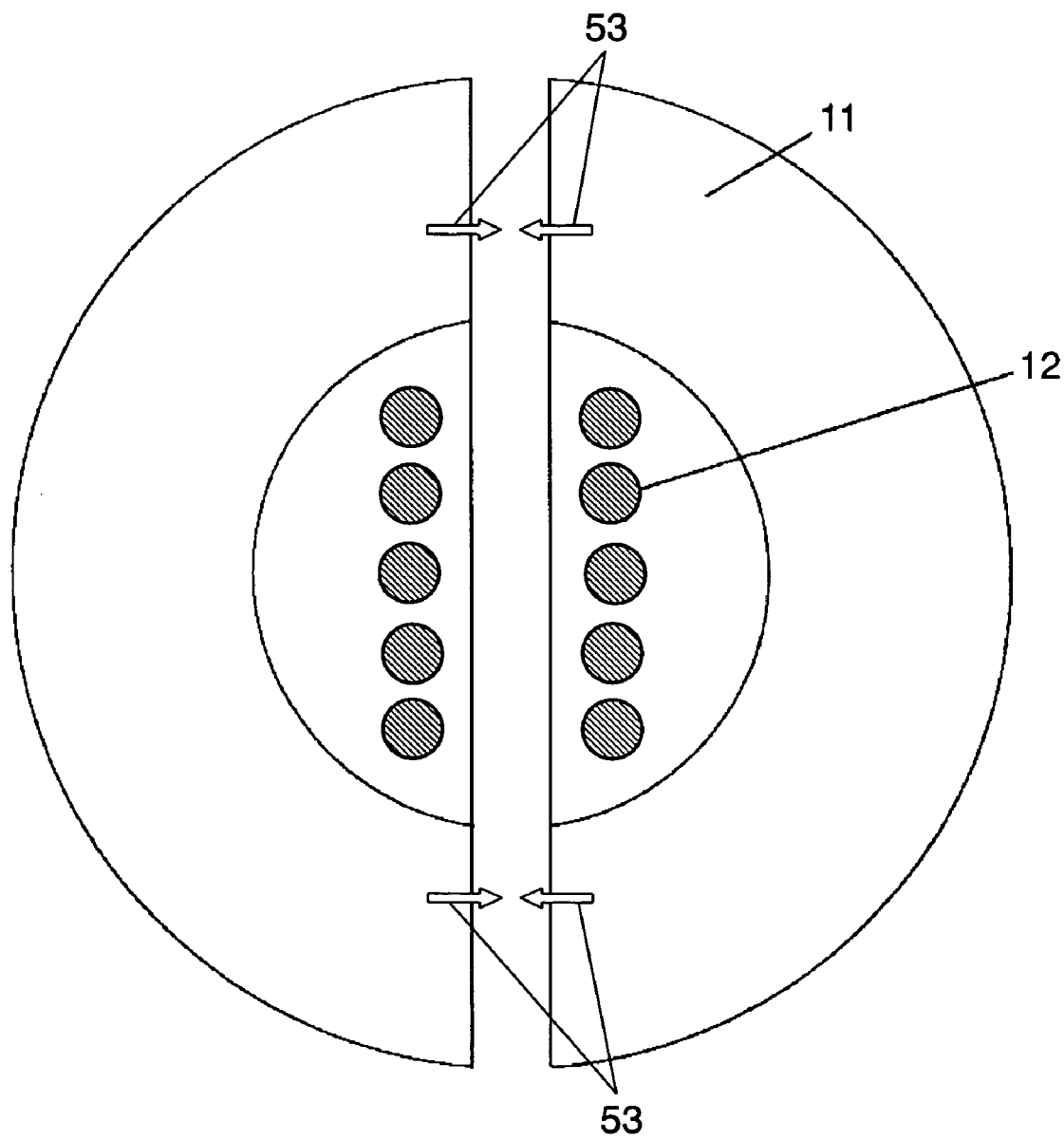
FIG. 5 shows a plan view from the side of light beam irradiation of the fiber-bundle in accordance with exemplary embodiment 2.
Figure 6:
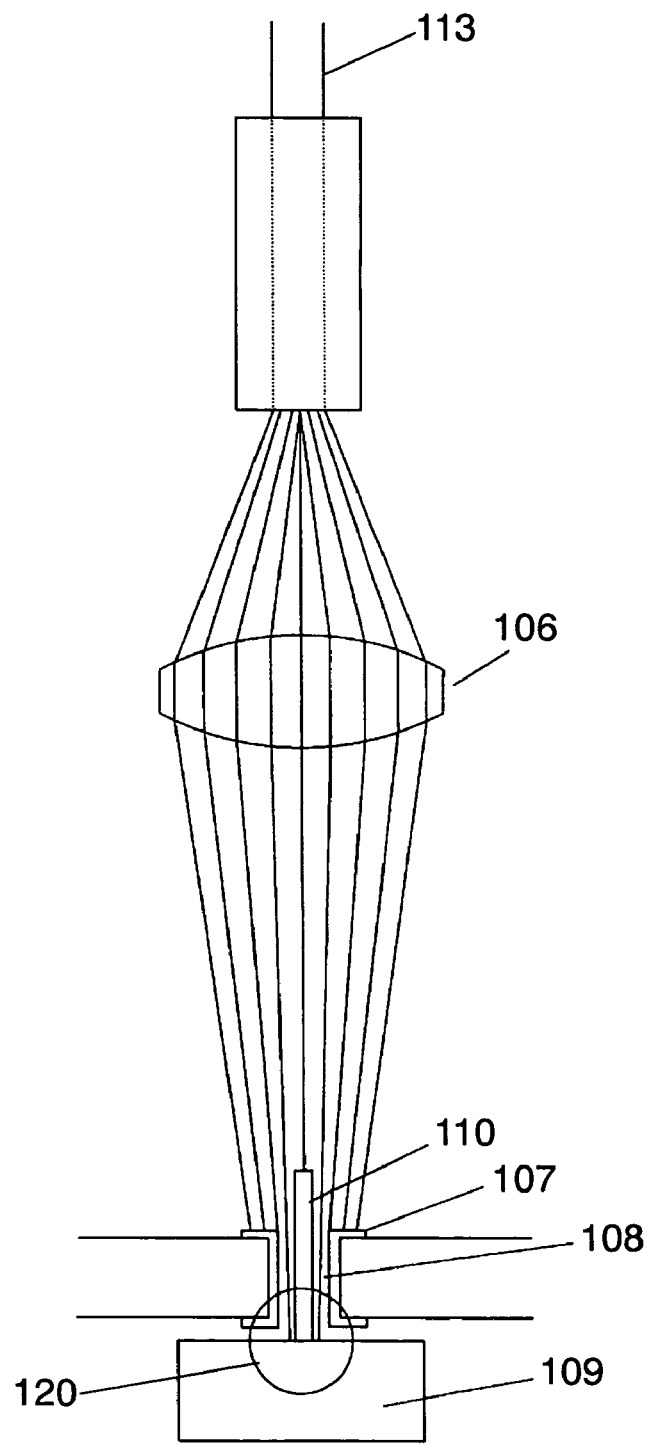
FIG. 6 shows a schematic view of a fiber-optic processing in the conventional fiber-optic processing equipment.
Figure 7:
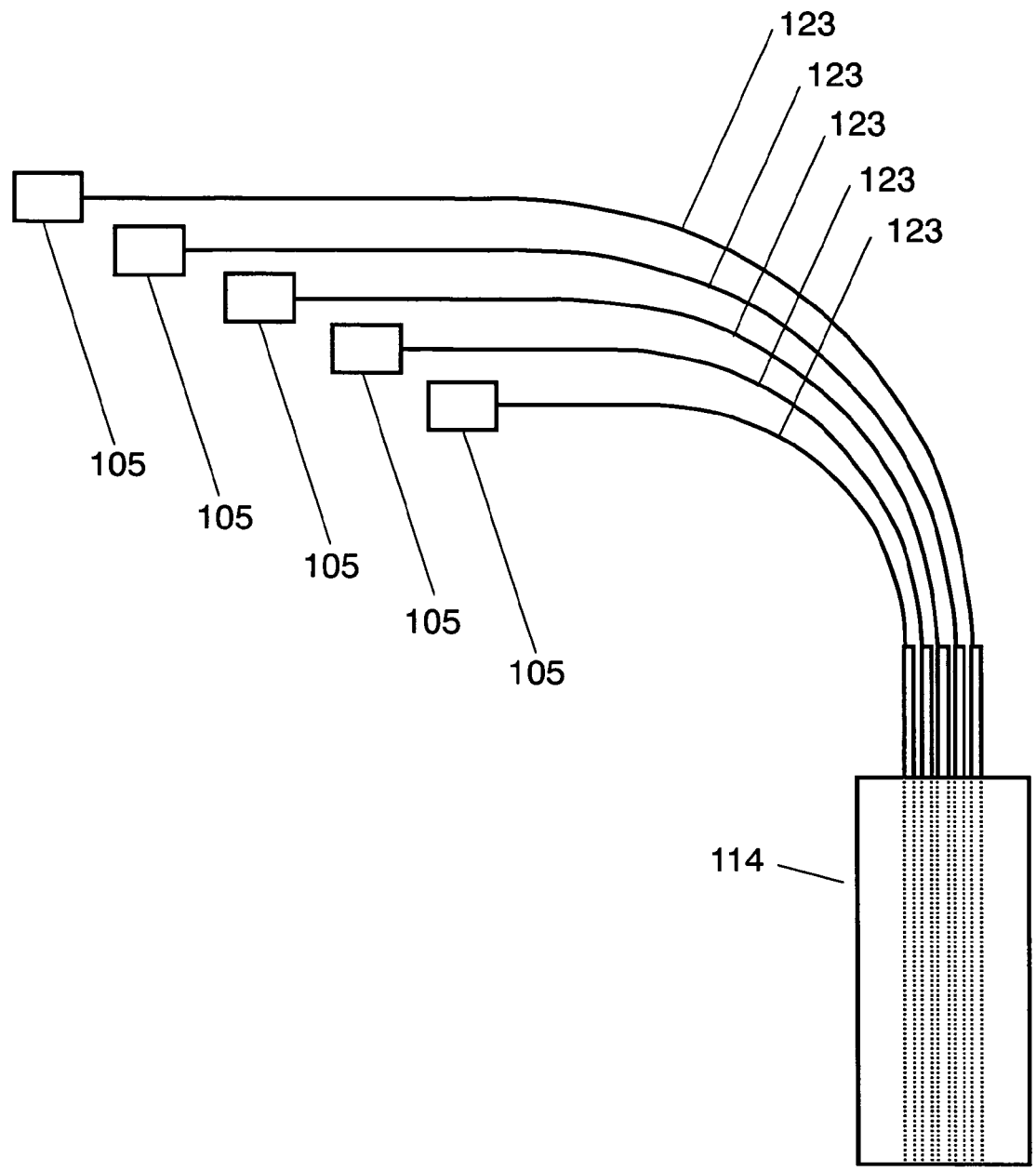
FIG. 7 shows a schematic view of an example of a fiber-bundle connected to laser diode elements in a conventional fiber-optic processing equipment.
Figure 8:
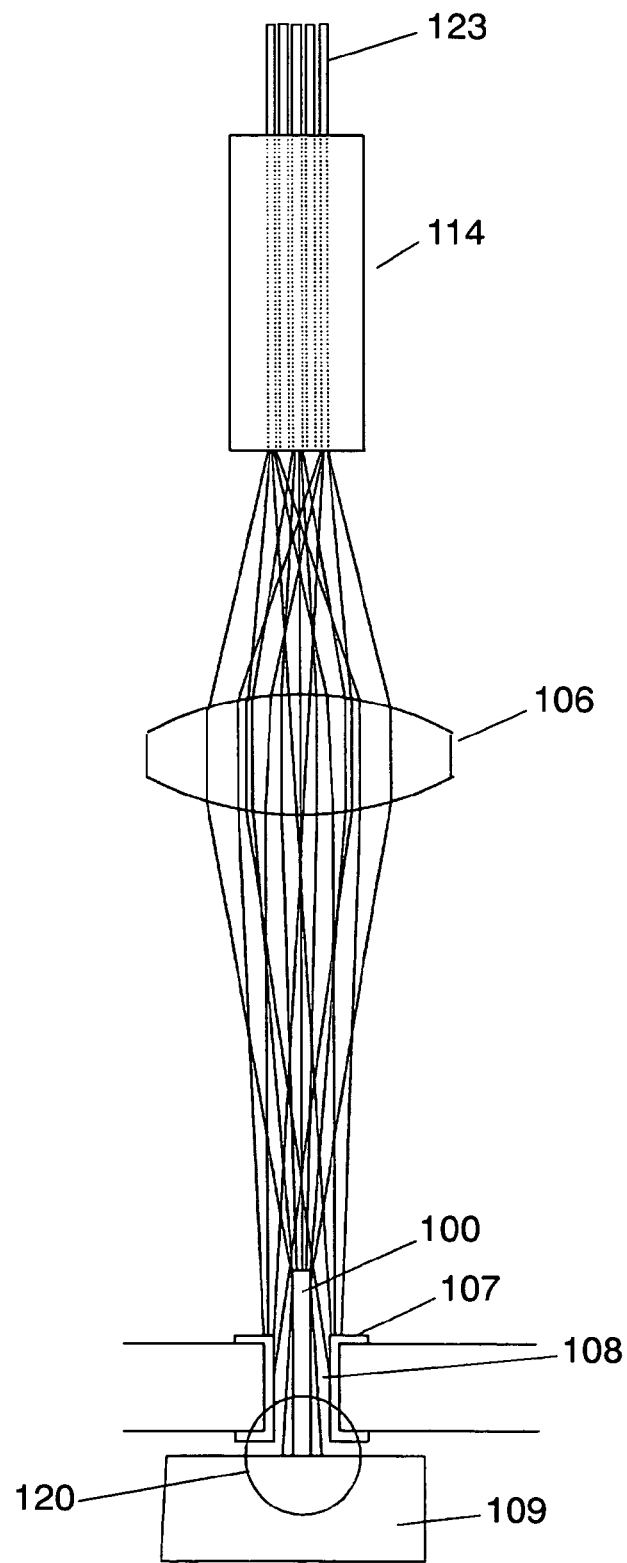
FIG. 8 shows a schematic view of a fiber-optic processing in the conventional fiber-optic processing equipment.
Figure 9:
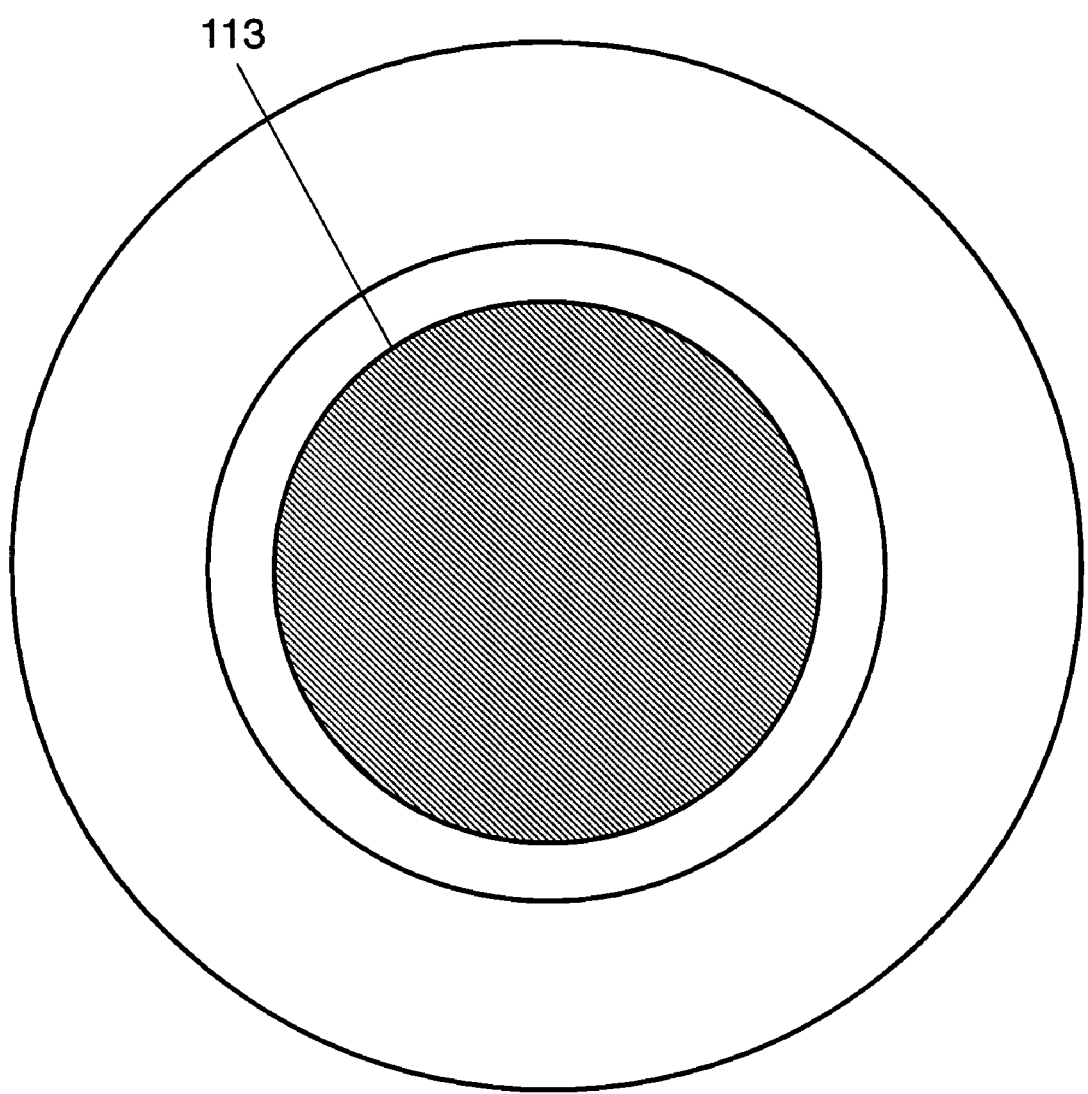
FIG. 9 shows a cross-sectional view of the fiber-bundle in a conventional fiber-optic processing equipment.
Figure 10:
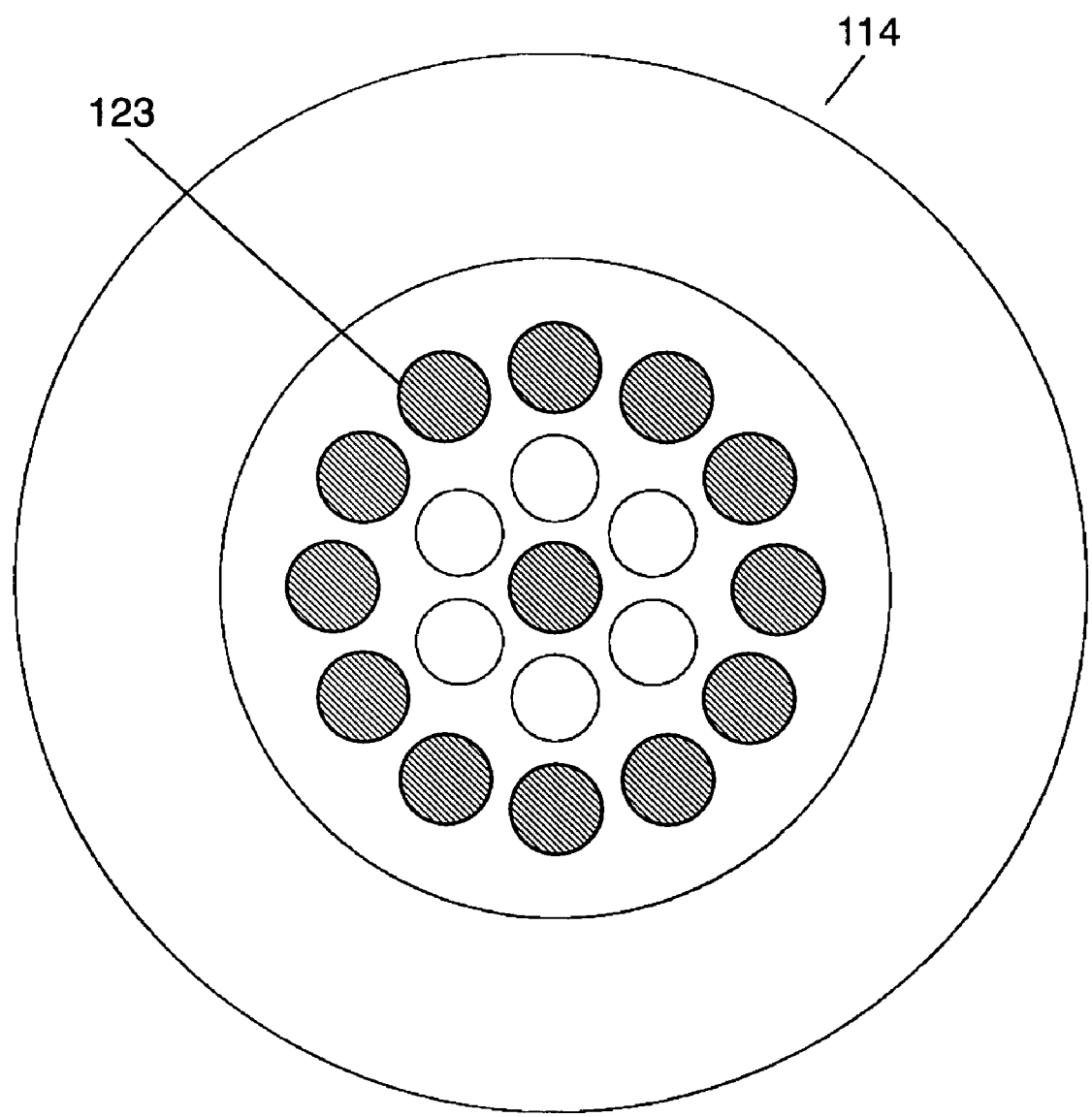
FIG. 10 shows a cross-sectional view of the fiber-bundle in a conventional fiber-optic processing equipment.

FIG. 5 shows a plan view of the fiber-bundle from the side of light beam irradiation. Tapered optical fiber holder 11 is separated into two halves and holes are provided processed on the tapered end approximately in parallel with each other to dispose a plurality of optical fibers 12 as shown in FIG. 5. Optical fibers 12 are inserted into the holes to be held fixed.

As described in embodiment 1, when runner 4 on optical fiber holder 11 is moved upward the tapered end portions will be induced to a compressed condition. This allows each separated tapered end of optical fiber holder 11 to deform elastically so as to fall inward to the center, resulting in optical fiber 12 disposed on each separated tapered end of optical fiber holder 11 to move in the direction so as to gather in the center as indicated by the arrow 53 in the drawing, causing optical fibers 12 to narrow in the parallel clearance and thereby enabling the irradiation pattern to vary.

Optical fiber holder 11 is applied for instance to heat terminals on both sides of chip parts or the like, wherein a plurality of chip parts with different pitch clearances between both sides can be adjusted individually so as to focus only on the terminal portions by adjusting the parallel clearance of optical fibers 12 disposed in parallel.

In aforementioned embodiments 1 and 2, the pressure applied on runner 4 to compress optical fiber holder 1 or 11 can be controlled either automatically or manually.

In aforementioned embodiments 1 and 2, the tapered end of optical fiber holder 1 or 11 can be separated into any number if the number is not less than two.

In aforementioned embodiments 1 and 2, each separated tapered ends of optical fiber holder 1 or 11 can be provided either with a single optical fiber or with a plurality of optical fibers to be held fixed respectively.

In aforementioned embodiments 1 and 2, although examples are described in which optical fiber holder 1 or 11 is compressed by runner 4, allowing the tapered portions to deform so as to fall inward to the center, resulting in optical fiber 3 or 12 to move in the direction, a configuration may be acceptable in which optical fiber 3 or 12 does not move so as to fall inward to the center but moves in parallel by using a generally-known lathe chuck mechanism.

Disposing of optical fiber 3 or 12 is not limited only to annular or parallel but various forms such as elliptical, triangular, quadrangular, star-shaped or the like may be acceptable.

What is claimed is:

1. A fiber-bundle comprising:
   an optical fiber holder having a plurality of discrete end portions;
   a bundle of a plurality of optical fibers each receives a light beam in one end and emits the light beam from an other end, a selected one of the optical fibers being disposed in a corresponding one of the discrete end portions; and
   an adjuster for adjusting distance between respective ends of said plurality of optical fibers at said other end.

2. The fiber-bundle of claim 1, wherein the adjuster is provided with a mechanical part to move light beam emitting portions of the optical fibers disposed in the discrete end portions.

3. The fiber-bundle of claim 2, wherein the mechanical part moves the light beam emitting portions of the optical fibers disposed in the discrete end portions by varying pressures applied on the optical fiber holder.

4. The fiber-bundle of claim 2, wherein the plurality of the optical fibers disposed in the discrete end portions are disposed annularly and the adjuster varies a diameter of a ring formed of emitted light beams by varying a position of each of the discrete end portions.

5. The fiber-bundle of claim 4, wherein a further optical fiber is disposed in a center portion of the plurality of the optical fibers disposed annularly.

6. A fiber-optic processing equipment comprising:
 a plurality of light sources;
 an optical fiber holder having a plurality of discrete end portions;
 a bundle of a plurality of optical fibers each receives a light beam emitted from the plurality of light sources and irradiates the light beam from an other end, a selected one of the optical fibers being disposed in a corresponding one of the discrete end portions;
 an adjuster for adjusting distance between respective ends of said plurality of optical fibers at said other end; and
 a focusing section to focus the light beam emitted from the plurality of optical fibers.

7. The fiber-optic processing equipment of claim 6, wherein the adjuster comprises
 a mechanical part to move light beam emitting portions of the optical fibers disposed in the discrete end portions.

8. The fiber-optic processing equipment of claim 7, wherein the mechanical part included in the adjuster moves the light beam emitting portions of the optical fibers disposed in the discrete end portions by varying pressures applied on the optical fiber holder.

9. The fiber-optic processing equipment of claim 7, wherein the plurality of the optical fibers disposed in the discrete end portions are disposed annularly and the adjuster varies a diameter of a ring formed of emitted light beams by varying a position of each of the discrete end portions.

10. The fiber-optic processing equipment of claim 9, wherein a further optical fiber is disposed further in a center portion of a plurality of the optical fibers disposed annularly.

11. The fiber-bundle according to claim 1, wherein the adjuster includes a tapered end portion which slides along a tapered mating portion which is about said optical fibers.

12. The fiber-optic processing equipment of claim 6, wherein the adjuster includes a tapered end portion which slides along a tapered mating portion which is about said optical fibers.

13. A fiber-bundle comprising:
 an optical fiber holder having a plurality of discrete end portions;
 optical fibers sets, each having at least two optical fibers, each of the optical fibers receives a light beam in one end and emits the light beam from an other end, respective sets of optical fibers being disposed in a respectively different one of the discrete end portions; and
 an adjuster for adjusting, at said other end, distances between or among ends of respective sets of optical fibers relative to ends of another respective set of optical fibers.

14. The fiber-bundle according to claim 13, wherein the adjuster maintains distances between or among optical fibers in the respective sets while adjusting the distance between or among optical fibers of different respective sets.

15. The fiber-bundle according to claim 13, wherein the optical fiber holder includes a center gap and a further optical fiber is fixedly disposed in the center gap of the optical holder such that the adjuster adjusts the distance between each of the optical fibers disposed in the discrete end portions of the optical fiber holder and the further optical fiber.

\* \* \* \* \*